United States Patent [19]

Compton et al.

[11] Patent Number: 5,156,649
[45] Date of Patent: Oct. 20, 1992

[54] TEST CLIP ADAPTER FOR INTEGRATED CIRCUIT DEVICE

[75] Inventors: Peter M. Compton, Beaverton; Paul A. Cole, Aloha, both of Oreg.

[73] Assignee: Tektronix, Inc., Wilsonville, Oreg.

[21] Appl. No.: 800,655

[22] Filed: Nov. 27, 1991

[51] Int. Cl.$^5$ .......................................... H01R 23/68
[52] U.S. Cl. .................................... 439/68; 439/912; 324/158 F; 324/158 P
[58] Field of Search .......................... 439/912, 68, 70; 324/158 F, 158 P

[56] References Cited

U.S. PATENT DOCUMENTS

| | | | |
|---|---|---|---|
| 4,530,552 | 7/1985 | Meehan et al. | 439/68 |
| 4,541,676 | 9/1985 | Hansen et al. | 439/68 |
| 4,564,251 | 1/1986 | Hansen et al. | 324/158 F |
| 4,671,590 | 6/1987 | Ignasiak | 439/266 |
| 4,735,580 | 4/1988 | Hansen et al. | 439/912 |
| 4,768,972 | 9/1988 | Ignastak et al. | 439/70 |
| 4,785,544 | 1/1989 | Hartman | 439/912 |
| 4,816,751 | 3/1989 | Seiichi et al. | 439/912 |
| 4,833,404 | 5/1989 | Meyer et al. | 324/158 F |
| 4,835,469 | 5/1989 | Jones et al. | 324/158 P |
| 4,996,476 | 2/1991 | Balyasny et al. | 439/912 |
| 5,049,813 | 9/1991 | Van Loan et al. | 324/158 P |
| 5,057,023 | 10/1991 | Kabadi et al. | 439/912 |

*Primary Examiner*—Gary F. Paumen
*Attorney, Agent, or Firm*—William K. Bucher

[57] ABSTRACT

An adapter for coupling electrical signal to and from an integrated circuit device mounted on a circuit board has a frame composed of individual side sections with each side section having ribs formed therein for providing detented cantilever engagement of the side sections to the sides of the IC device. Electrically conductive elements fit in between the ribs and engage the leads on the IC. The electrically conductive elements are connected to conductive pads formed on a substrate that is secured with the frame. A securing means that includes pins are used for securing the side sections together.

10 Claims, 5 Drawing Sheets

TEST CLIP ADAPTER FOR INTEGRATED CIRCUIT DEVICE

The present invention relates to test clip adapters for integrated circuit devices and more particularly to a test clip adapter structure that accommodates integrated circuit devices having varying shapes and lead pitches.

BACKGROUND OF THE INVENTION

The electronic industry is increasingly using surface mount technology for securing high pin count, small dimension integrated circuit (IC) devices to circuit boards. It has proven difficult to test such devices with existing electrical test probes due to the close spacing of the IC leads. To overcome this problem, test clip adapters have been designated, which fit down on the IC device and provide electrical signal paths to an associated test head assembly. The test head assembly has spaced apart test points formed it int, which allows easy probing of the IC device. One example of such a test clip adapter is described in U.S. Pat. application Ser. No. 07/530,141, filed may 24, 1990, to Paul A cole et. al., entitled "An Adapter And Test Fixture For An Integrated Circuit Device Package" and assigned to the assignee of the present invention.

The test clip adapter described in Cole has an injection-molded housing generally conforming to the size of the IC for which it is designed. The housing has a top and orthogonally depending sidewalls forming a cavity into which the IC fits. The sidewalls have inner and outer surfaces with vertical grooves formed in the outer surface near the top. Further down the sidewalls the grooves extend through the sidewalls forming a comb structure of ribs and slots. Electrically conductive elements fit into the grooves and are secured in the sidewalls by coverplates. The electrically conductive elements have contact lead segments that extend into the housing cavity for engaging the leads of the IC. The electrically conductive elements extend above the top of the housing and form contact lead pads for engaging corresponding contact pads on a test head, which is secured to the adapter.

One drawback to this type of design is that separate molding dies have to be produced for each of the numerous IC package configurations. These configurations may be square or rectangular in shape and have lead counts from 44 to 232 or higher. Additionally, the lead pitch or spacing between leads may vary between IC's. Currently, the must widely used lead spacings are 0.65 mm, 0.8 mm, 1 mm, and 0.025 inches.

What is needed is an adapter for surface mounted integrated circuit devices that can be used with IC devices of varying configurations and lead pitch spacing without the expense of producing individual molding dies for each adapter.

SUMMARY OF THE INVENTION

Accordingly, the present invention is an adapter for an integrated circuit device having a substrate, electrically conductive elements, and a plurality of side sections connected together to from a frame. The substrate has opposed parallel surfaces with electrically conductive pads formed thereon. The electrically conductive elements have orthogonally disposed members with one member having a first portion parallel with the surfaces of the substrate and a second portion making electrical contact with the conductive pads. The other member is movable from a first to a second position for engaging leads on the integrated circuit. The side section have a top beam, depending sidewalls, and means for engaging the substrate and the electrically conductive elements within the side section frame. The top beams define a central opening into which the substrate is secured. The sidewalls define a cavity into which ribs formed in the sidewall extend. The ribs provide detented cantilever engagement of the sidewall. to side surfaces of the integrated circuit device. Means are provided for securing the interlocking sections together.

In a further aspect of the invention, the securing means has a base with opposing surfaces and pins positioned on one of the surfaces in spaced relationship with apertures formed in the side section for connecting the side section together. The base further has contact pads formed on the surface containing the pins for engaging the conductive pads on the substrate. Electrical contact points are formed on the other surface that are electrically connected t the contact pads.

The objects, advantages and novel features of the present invention are apparent from the following detailed description when read in conjunction with appended claims and attached drawings.

DETAILED DESCRIPTION OF THE PREFERRED EMBODIMENT

Figure 1:
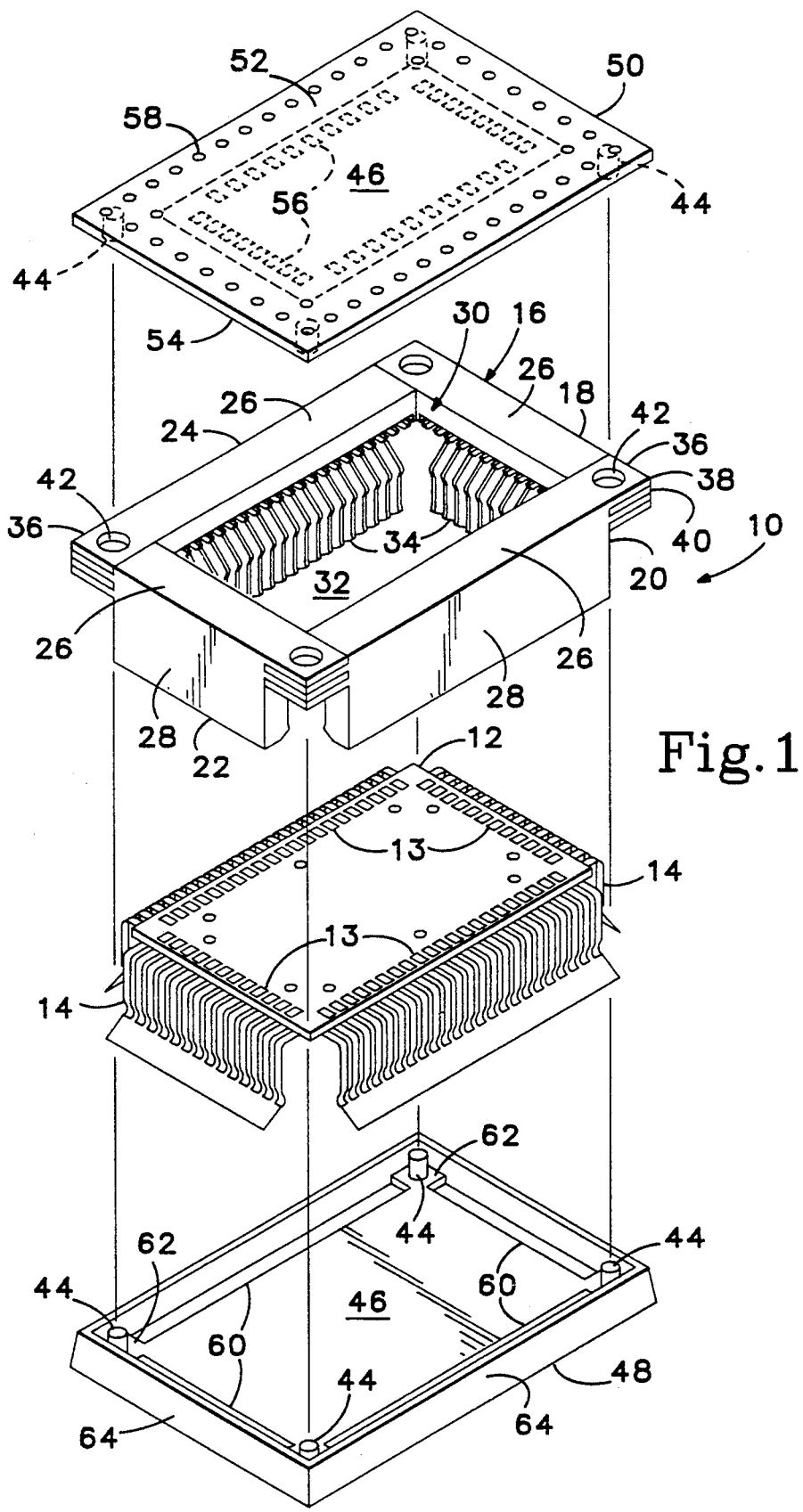
FIG. 1 is an exploded perspective view of the adapter with alternative securing means according to the present invention.

Referring to FIG. 1 there is shown an exploded perspective view of an adapter 10 according to the present invention. The adapter 10 includes a substrate 12 having electrically conductive pads 13 formed on opposite major surfaces thereof. Connected to the conductive pads 13 are electrically conductive elements 14 for engaging leads on an integrated circuit (IC) device (not shown) when the adapter 10 is placed on the IC. A frame 16 is formed from individual side section 18, 20, 22, and 24 with each side section 18-24 having a top beam 26 and depending sidewalls 28. The top beams 26 define a central opening 30 in the adapter 10 for receiving the substrate 12. The sidewalls 28 define a cavity 32 into which the integrated circuit device is positioned. The sidewalls 28 have ribs 34 formed thereon that extend into the cavity 32 for providing detented cantilever engagement of the sidewalls 28 to the sides of the integrated circuit device. The side sections have complementary interlocking end members 36 formed as alternating fingers 38 and slots 40 with the fingers 38 of one end member 36 mating with the slots 40 of another end member 36. Apertures 42 are formed in the fingers 38 of one end member 36 mating with the slots 40 of another end member 36. Apertures 42 are formed in the fingers 38 for accepting pins 44 or other type of securing means for connecting the side section 18-24 together. The individual pins 44 may be positioned on a base 46 in spaced relationship with the apertures 42 in the fingers 38. The base 46 may be a part of an alignment bezel 48 or a test head 50.

The adapter 10 provides an interface between an IC device mounted on a circuit board and a test head. The test head may be a separate device as shown and described in Cole et. al., or it may be formed as an integral part of the adapter as shown in FIG. 1. The base 46 of the test head 50 has top and bottom surfaces 52 and 54 with electrical contact pads 56 formed on the bottom surface 54, which mate with the corresponding electrically conductive pads 13 on the substrate 12. Pins 44 are formed or affixed on the same surface as the contact pads 56 for securing the side section 18-24 together. Electrical contact points 58 are formed on the top surface 52 and are electrically connected to the respective contact pads 56 on the bottom surface 54 by conductive runs 110, shown in greater detail in FIG. 2A. The contact points 58 may be formed as plated through holes 112 for accepting a conductive sleeve 114 recessed into the base 46 or wire pins extending above the base 46.

If the test head 50 is a separate device, the alignment bezel 48 may be used as an alternative device for securing the side sections 18-24 together. The alignment bezel base 46 is configured for insertion into the cavity 32 of the adapter 10. To accomplish this, notches 60 are formed in the base 46 to allow passage of the base 46 past the sidewalls 28 of the side sections 18-24. The notching of the base 46 forms protrusions 62 at the corners of the base 46, which accept the pins 44 for securing the side section 18-24 together. Upstanding sidewalls 64 may be formed on the base 46 to provide added structural support for the bezel 48.

Figure 2A:
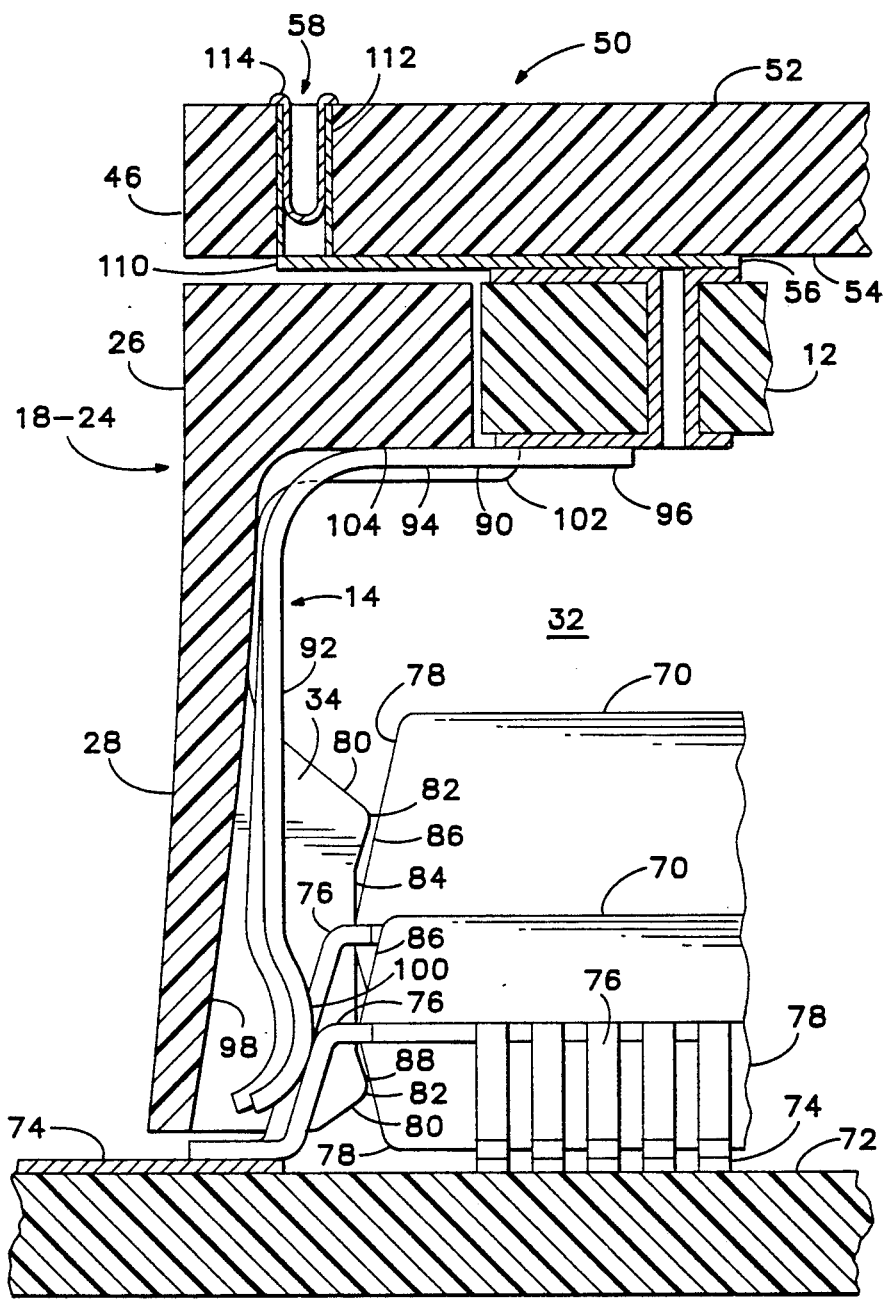
FIGS. 2A and 2B are a cross-sectional views of the adapter according to the present invention.
Figure 2B:
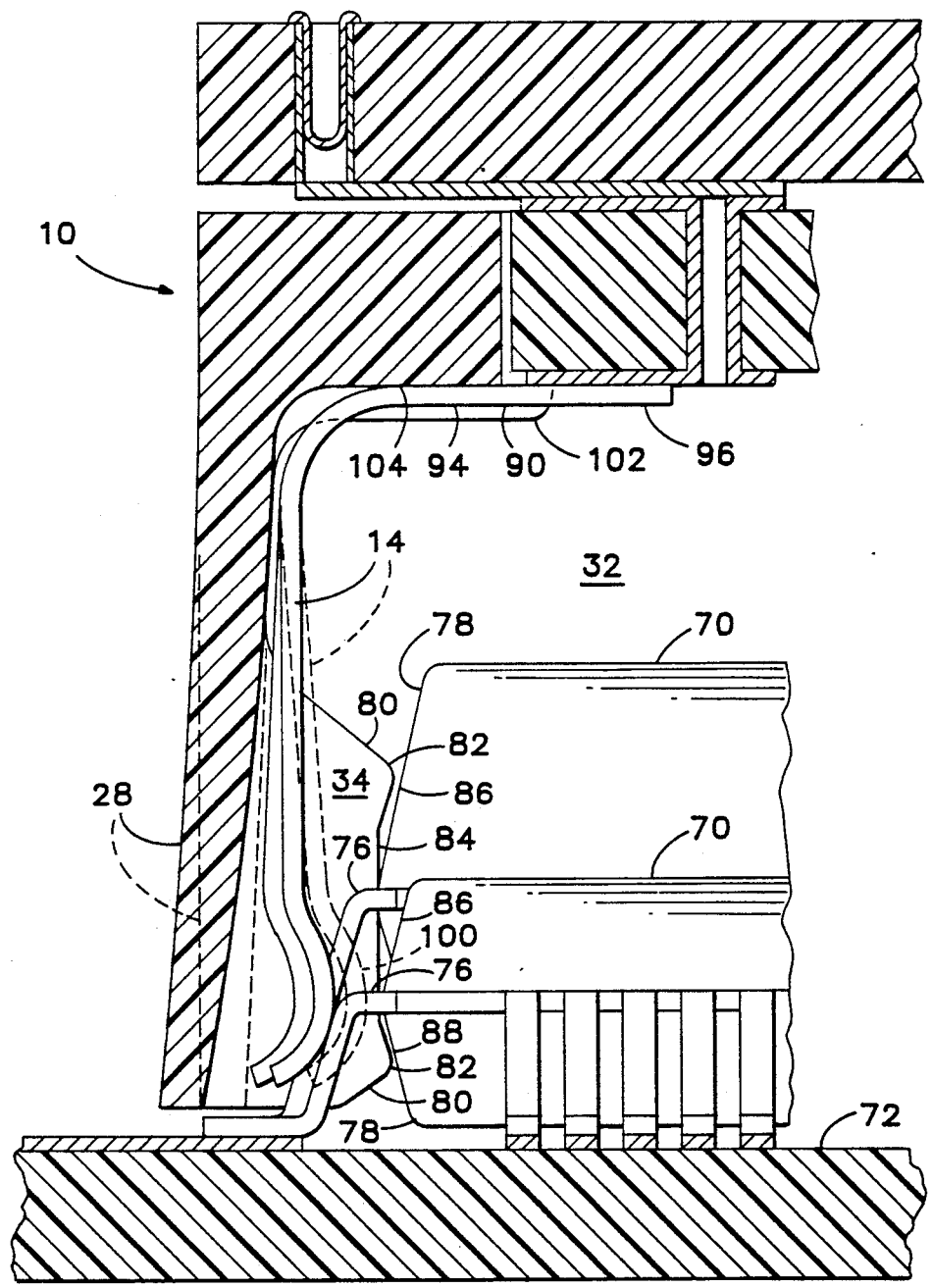

The adapter 10 of the present invention may be used with plastic quad flat pack (PQFP) type integrated circuit devices 70, shown in the cross-sectional views of FIGS. 2A and 2B, that are surface mounted to conductive runs 74 formed on a circuit board 72. PQFP type devices 70 may have a tall or a short body structure with leads or legs 76 extending from their sides 78 that range in number from 44 to close to 300. The lead pitch or spacing between leads 76 may vary between devices with the most common lead pitches being 0.65 mm, 0.85 mm, and 1 mm and 0.25 inches. To meet the needs for various sizes and lead pitches of PQFP devices 70, the frame 16 is made of individual side sections 18-24. As previously described, each side section 18-24 has a top beam 26 and depending sidewalls 28 that have ribs 34 extending into the cavity 32 formed by the sidewalls 28. Each rib 34 has opposing angularly depending tip ramps 80 that transition into tip pawls 82. Separating the tip pawls 82 is a planar surface 84 that is substantially parallel to the sidewalls 28. Each rib 34 is configured to produce contact pressure on the side surfaces 78 of the IC device at a single pressure point. As shown in FIG. 2B, the side surfaces 78 of PQFP devices 70 are angled to allow mold release during the plastic molding process. The lower tip pawl 82 rides over the outwardly angled side surface 86 displacing the sidewall 28 by cantilever action. A detenting action occurs as the lower tip pawl 82 rides over the inwardly angled side surface 88 with the planar surface 84 of the rib 34 engaging the side surface 70 of the IC. The adapter 10 is equally well suited for engaging hybrid circuit devices having vertical side surfaces. Instead of the planar surface 84 providing the contact point on the vertical side surface of the hybrid one of the tip pawls 82 engages the vertical surface. In addition, the detenting action may occur if the hybrid is raised sufficiently above the circuit board 72 for the lower tip pawl 82 to ride under the bottom of the hybrid.

Referring to FIG. 2A, the electrically conductive elements 14 are disposed between the ribs 34. Elements 14 may be made from solid sheets of beryllium-copper alloy that are plated with a layer of gold over a layer of nickel. The beryllium-copper sheets are chemically etched and bent to form the approximately orthogonal disposed members 90 and 92. Member 90 has a first portion 94 that is parallel t the surfaces of the substrate 12 and a second portion 96 that makes electrical contact with a conductive pad 13 on the substrate 12. As will be discussed in greater detail below, the second potion 96 may have various configurations based on the substrate 12 structure. Member 92 extends down along the inner surface 98 of the sidewalls 28 and has an inwardly disposed portion 100 for engaging the lead 76 of the IC. Depending on the length of the first portion 94 of member 90, member 92 may be slightly angled for engaging the lead 76 on the IC 70.

As the adapter 10 is forced down on the IC 70, FIG. 2B, the lower tip ramp 80 contacts the side 78 of the IC 70. Continued downward pressure on the adapter 10 brings the lower tip pawl 82 into contact with the side surface 78 of the IC forcing the sidewalls 28 outward in a cantilever action as shown by the dashed sidewall and bringing the electrically conductive elements 14 into contact with the leads 76 of the IC 70. Further downward pressure displaces the conductive element 14 away from its at rest position as shown by the dashed lead providing a sliding-wiping engagement of the lead 76 by the conductive element 14. In addition, the conductive element 14 applies a side-normal contact force to lead 76.

The cross-sectional drawings of FIGS. 2A and 2B also show the structure for engaging the substrate 12 to the side sections 18-24. Each side section has shoulders 102 formed thereon that extend into the cavity 32. The shoulders 102 lie in the vertical plane of the ribs 34 formed in the sidewalls 28. In the preferred embodiment, the shoulders 102 are coextensive with each of the ribs 34 but the invention is not necessarily limited to this implementation. Fewer shoulders 102 may be used as long as they provide adequate support for the substrate 12. Bearing surfaces 104 are formed on the under surface of the top beam 26 adjacent to the shoulders 102. The bearing surface 104 receives the first portion 94 of the electrically conductive member 90. The combination of the substrate 12 resting on the shoulders 102 of the side sections 18-24 and the first portions 94 of the conductive elements 14 engaging the baring surfaces 104 of the sections 18-24 secures the substrate 12 in the central opening 32 of the adapter 10.

Figure 3A:
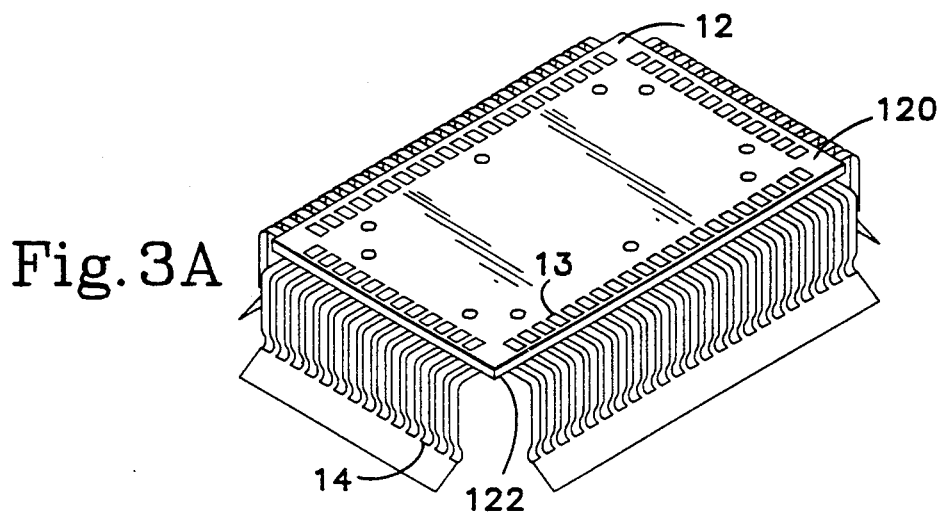
FIG. 3A and 3B are perspective views of two embodiments of the substrate and electrically conductive elements according to the present invention.
Figure 3B:
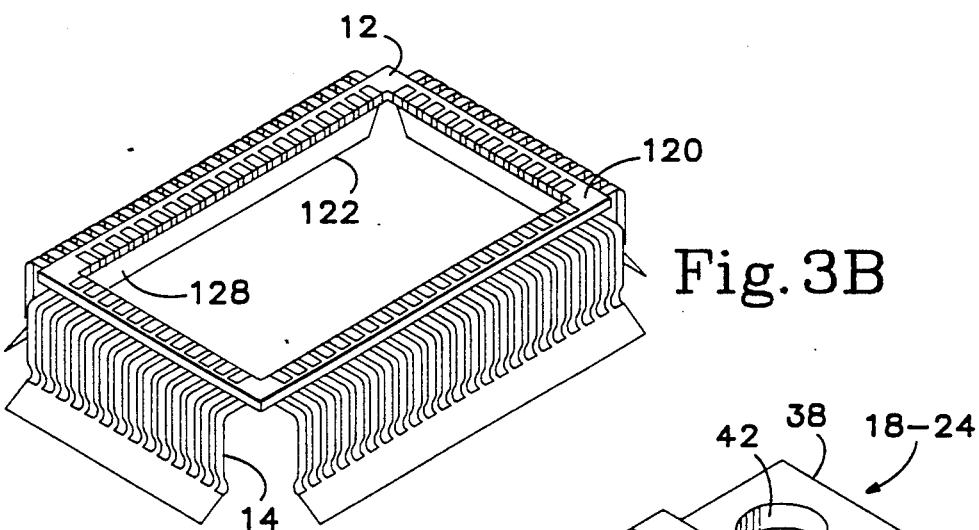
Figure 4A:
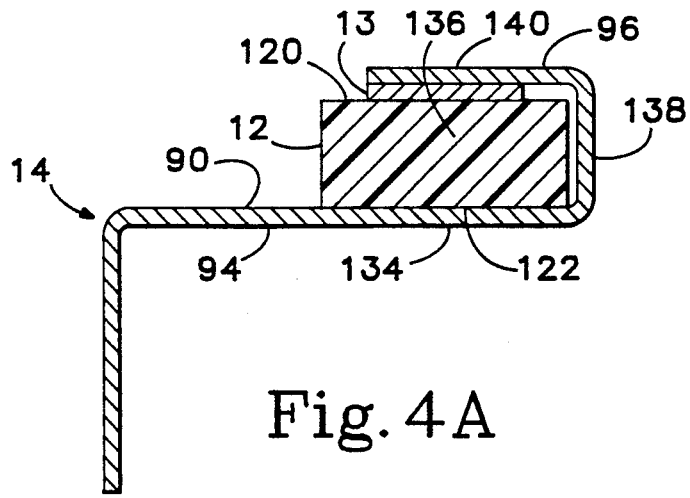
FIGS. 4A–4C are cross-sectional views of alternative electrically conductive element configuration according to the present invention.
Figure 4B:
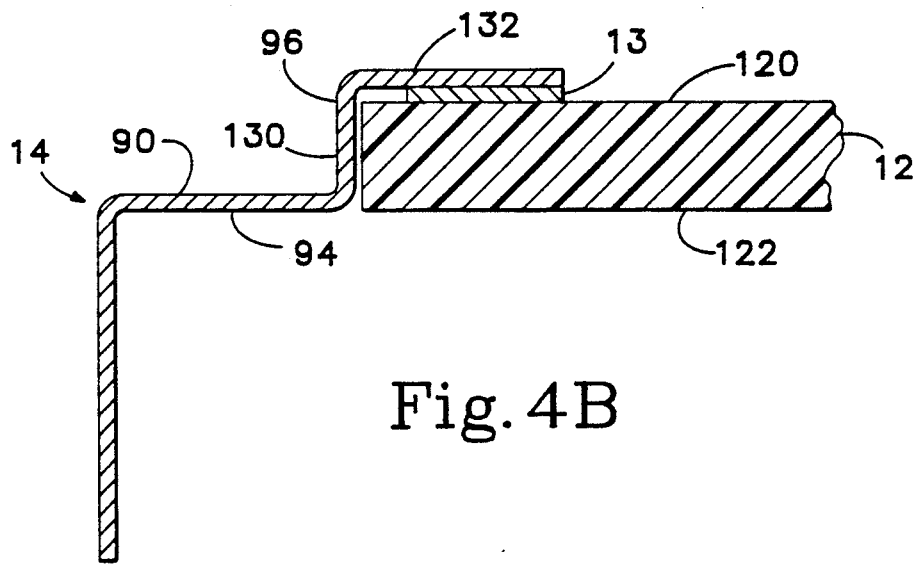
Figure 4C:
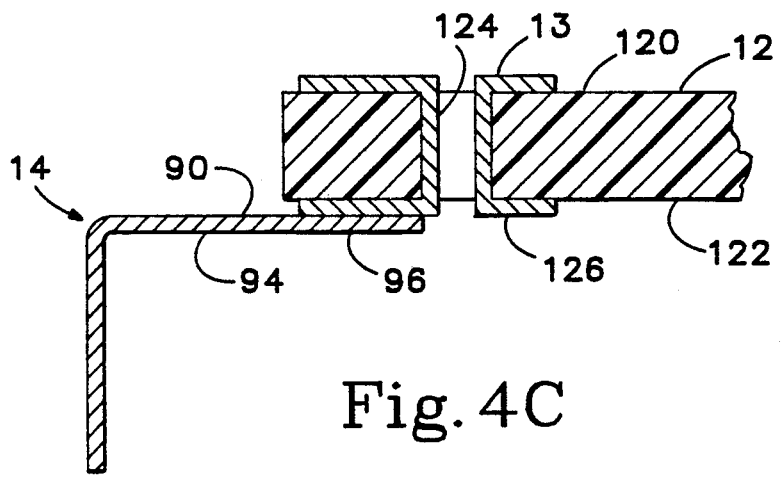

The perspective views of FIGS. 3A and 3B and the cross-section views of FIGS. 4A-C show alternative substrate 12 structures and various electrically conductive element 14 configurations. The overall shape of the substrate 12 is a function of the shape of the particular IC device for which the adapter 10 is made. These shapes are generally rectangular or square but the adapter 10 of the present invention may be configured to mate with other kinds of shapes, such a trapezoidal, triangular or the like. The substrate 12 is made of circuit board material having a top and bottom surface 120 and 122. Electrically conductive pads 13 may be formed on the top surface 120 as is shown in FIGS. 4A and 4B or the pads may be formed with a plated through hole 124 connecting to a corresponding pad 126 on the bottom surface 122, as shown in FIG. 4C. The substrate 12 may be formed from a solid piece of circuit board material as shown in FIG. 3A or it may have a central portion 128 removed forming a rectangular donut shape as shown in FIG. 3B.

As shown in FIGS. 4A–C, the electrically conductive elements 14 are configured for soldering onto the conductive pads 13 of the substrate 12. The shape of the second portion 96 of the orthogonally disposed member 90 is dependant on the placement of the conductive pads 13 on the substrate 12 and the structure of the substrate 12. FIG. 4C shows the second portion 96 of the member 90 being a lateral extension of the first portion 94 when the conductive pad 13 is formed with the plated through hole 124 and the corresponding pad 126 on the bottom surface 122 of the substrate 12. FIGS. 4A and 4B show the conductive pad 13 formed on the top surface 120 of the substrate 12 with the second portion 96 of the orthogonally disposed member 90 being shaped to engage the conductive pad 13. In FIG. 4B, the second portion 96 forms orthogonally disposed segments 130 and 132 with the first segment 130 being normal to the first portion 94 and having a length approximately equal to the thickness of the substrate 12. The second segment 132 extends over the substrate 12 for connecting to the conductive pad 13. In FIG. 4A, the second portion 96 of member 90 has a U-shaped configuration for mounting on the donut shaped substrate 12 as shown in FIG. 3B. Section 96 has a first segment 134 extending laterally from the first portion 94 and has a dimensional length approximately equal to that of the substrate section 136. The first segment 134 transitions into an upwardly extending, orthogonally disposed second segment 138 having a length approximately equal the thickness of the substrate 12. An orthogonally disposed third segment 140 transitions from the second segment 138 over the first segment for connecting the electrically conductive element 14 to the conductive pad 13 on the substrate 12.

Figure 5:
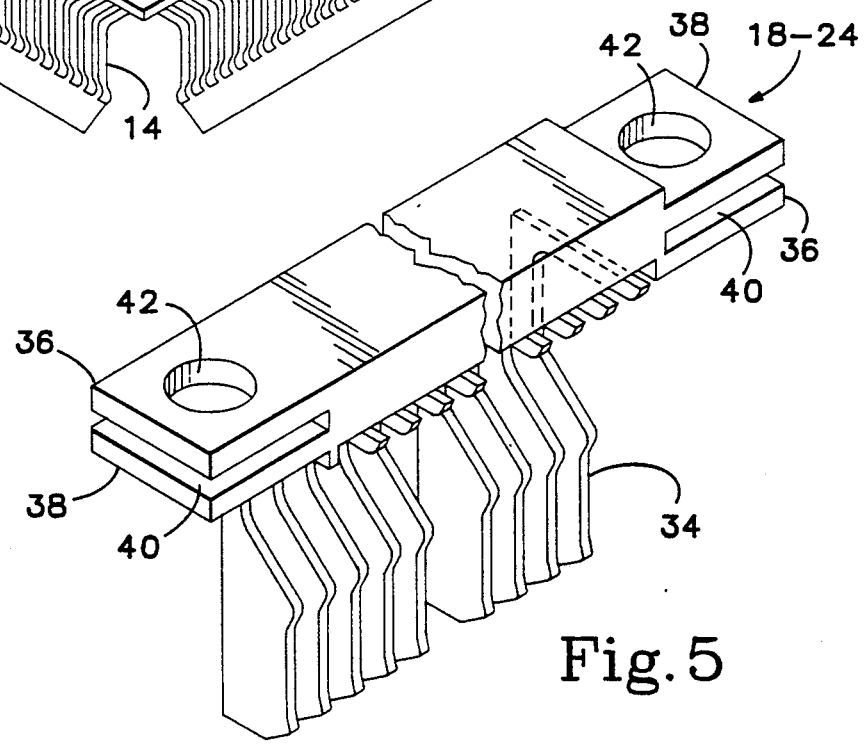
FIG. 5 is a perspective view of the frame side section according to the present invention.

Referring to FIG. 5, there is shown a perspective view of one of the side sections 18–24 for forming the frame 16 of the adapter 10. The side sections 18–24 are made of an insulative material, such as polycarbonate with a percentage of glass fill, and may be formed using an injection molding process. As has been previously described, PQFP integrated circuits have various shapes and lead pitches. Employing the unitary frame strcuture, as described in Cole et. al., requires the creation of injection molding dies for each combination of IC shape and lead pitch. Replacing the unitary frame structure with a frame strcuture having individual side sections eliminates the IC shape as a variable in the creation of the injection molding dies. Each molding die is now a function of the lead pitch of the IC device and the length of the longest side of any IC in the pitch family. For example, there are seven IC devices within the 0.65 mm lead pitch family having side dimensions ranging from 0.390 to 1.579 inches. Instead of seven individual unitary frame molding dies, a single molding die is used to form the side section 18–24 with the dimension of the molded side section being the longest dimension side of the family. A secondary operation, such as milling, laser cutting, or the like, is used to cut the side section to the proper dimension for the particular IC side dimension and to form the interlocking end sections 36. Alternatively, if multiple IC's of a particular family have a common side dimension, a molding die may be made for that particular side section 18–24, which includes the interlocking end members 36.

An adapter has been described for use with integrated circuit devices that includes a frame made of interlocking side sections. Each side section has ribs formed therein for providing detented cantilever engagement of the sides of the IC device as the adapter is positioned on the IC. Electrically conductive elements are positioned between each of the ribs for engaging leads on the IC and are electrically connected to conductive pads formed on a substrate that is secured in the frame. Means are provided for securing the side sections together. These and other aspects of the present invention are set forth in the appended claims.

We claim:

1. An adapter for coupling electrical signals to and from an integrated circuit device having side surfaces with electrical leads extending therefrom and mounted on a circuit board, the adapter comprising:

a substrate having opposed parallel major surfaces with electrically conductive pads formed thereon;

electrically conductive elements having approximately orthogonal disposed members with one member having a first portion parallel to the major surfaces of the substrate and a second portion making electrical contact with the conductive pads and the other member being movable from a first to a second position for engaging the leads on the integrated circuit deice;

a plurality of separate side sections with each section having a top beam, a depending sidewall, and means for engaging the substrate and the electrically conductive elements, the plurality of side sections being connected together to from a frame having a central opening and cavity with the top beams defining the central opening into which the substrate is secured and the depending sidewalls defining the cavity with the sidewalls having ribs formed therein that extend into the cavity for providing detented cantilever engagement of the sidewalls to the side surfaces of the integrated circuit device; and means for securing the side sections together.

2. The adapter as recited in claim 1 wherein each pad on one of the major surfaces being electrically connected to a respective pad on the opposing major surface.

3. The adapter as recited in claim 1 wherein the engaging means comprises shoulders and bearing surfaces formed in the side sections with the shoulders extending into the cavity adjacent to the central opening for receiving the substrate and the bearing surfaces extending into the side sections for receiving the parallel first portions of the electrically conductive elements.

4. The adapter as recited in claim 1 wherein the ribs further comprise opposing angularly depending tip ramps transitioning into tip pawls separated by a planar surface substantially parallel to the sidewalls with each rib engaging one of the side surfaces of the integrated circuit device at a single pressure point.

5. The adapter as recited in claim 1 wherein the side section further comprise interlocking end members having alternating fingers and slots with the fingers of one end member mating with the slots of another end member.

6. The adapter as recited in claim 5 wherein the fingers of the interlocking end members have apertures formed therein for accepting the securing means.

7. The adapter as recited in claim 6 wherein the securing means comprises pins insertable into the apertures of the fingers for locking the side sections together.

8. The adapter as recited in claim 7 wherein the securing means further comprises a base having the pins positioned thereon in spaced relationship with the apertures formed in the fingers of the interlocking end sections.

9. The adapter as recited in claim 8 wherein the base has a top and bottom surface and further comprises electrical contact pads formed on the bottom surface for engaging the conductive pads on the substrate and electrical contact points formed on the upper surface with the electrical contact points being electrically connected to the electrical contact pads.

10. The adapter as recited in claim 8 wherein the securing means further comprises sidewalls formed on the base with the base being notched adjacent to a substantial portion of the sidewalls for accepting the sidewalls of the side sections.

* * * * *